(12) United States Patent
Nistler

(10) Patent No.: US 7,902,821 B2
(45) Date of Patent: Mar. 8, 2011

(54) MAGNETIC RESONANCE APPARATUS AND OPERATING METHOD WITH AUTOMATED DETERMINATION OF AN OPTIMIZED RADIO FREQUENCY TRANSMIT MODE

(75) Inventor: Juergen Nistler, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 956 days.

(21) Appl. No.: 11/734,898

(22) Filed: Apr. 13, 2007

(65) Prior Publication Data

US 2007/0255128 A1 Nov. 1, 2007

(30) Foreign Application Priority Data

Apr. 13, 2006 (DE) .......................... 10 2006 017 439

(51) Int. Cl.
*G01V 3/00* (2006.01)
(52) U.S. Cl. ....................................................... 324/307
(58) Field of Classification Search .......... 324/300–322; 600/410–435
See application file for complete search history.

(56) References Cited

U.S. PATENT DOCUMENTS

| | | | |
|---|---|---|---|
| 6,043,658 A | | 3/2000 | Leussler |
| 6,650,118 B2 * | | 11/2003 | Leussler ........................ 324/318 |
| 7,221,162 B2 * | | 5/2007 | Feiweier et al. .............. 324/318 |
| 7,622,921 B2 * | | 11/2009 | Fontius et al. ................ 324/307 |
| 2002/0011843 A1 | | 1/2002 | Harvey |
| 2004/0193038 A1 | | 9/2004 | Reykowski et al. |
| 2005/0083054 A1 | | 4/2005 | Feiweier et al. |
| 2005/0231203 A1 | | 10/2005 | Feiweier et al. |
| 2005/0272998 A1 | | 12/2005 | Diehl et al. |

* cited by examiner

*Primary Examiner* — Melissa J Koval
*Assistant Examiner* — Dixomara Vargas
(74) *Attorney, Agent, or Firm* — Schiff Hardin LLP

(57) ABSTRACT

In a magnetic resonance system and operating method to set RF transmit parameters for a radio-frequency antenna that is excitable in a number of different, linearly independent transmit modes, the transmit antenna is successively excited in the different transmit modes, and, for each transmit mode in which the radio-frequency antenna is excited, a measured value distribution representing the radio-frequency field produced by the antenna in a defined volume area is determined. The homogeneity of the measured value distribution is evaluated with respect to a defined evaluation criterion and, if the evaluation criterion is satisfied, an optimized radio-frequency field distribution is determined from a combination of the measured value distributions up to that time. If the evaluation criterion is not fulfilled, the radio-frequency antenna is excited with a further transmit mode, and the procedure is repeated.

10 Claims, 3 Drawing Sheets

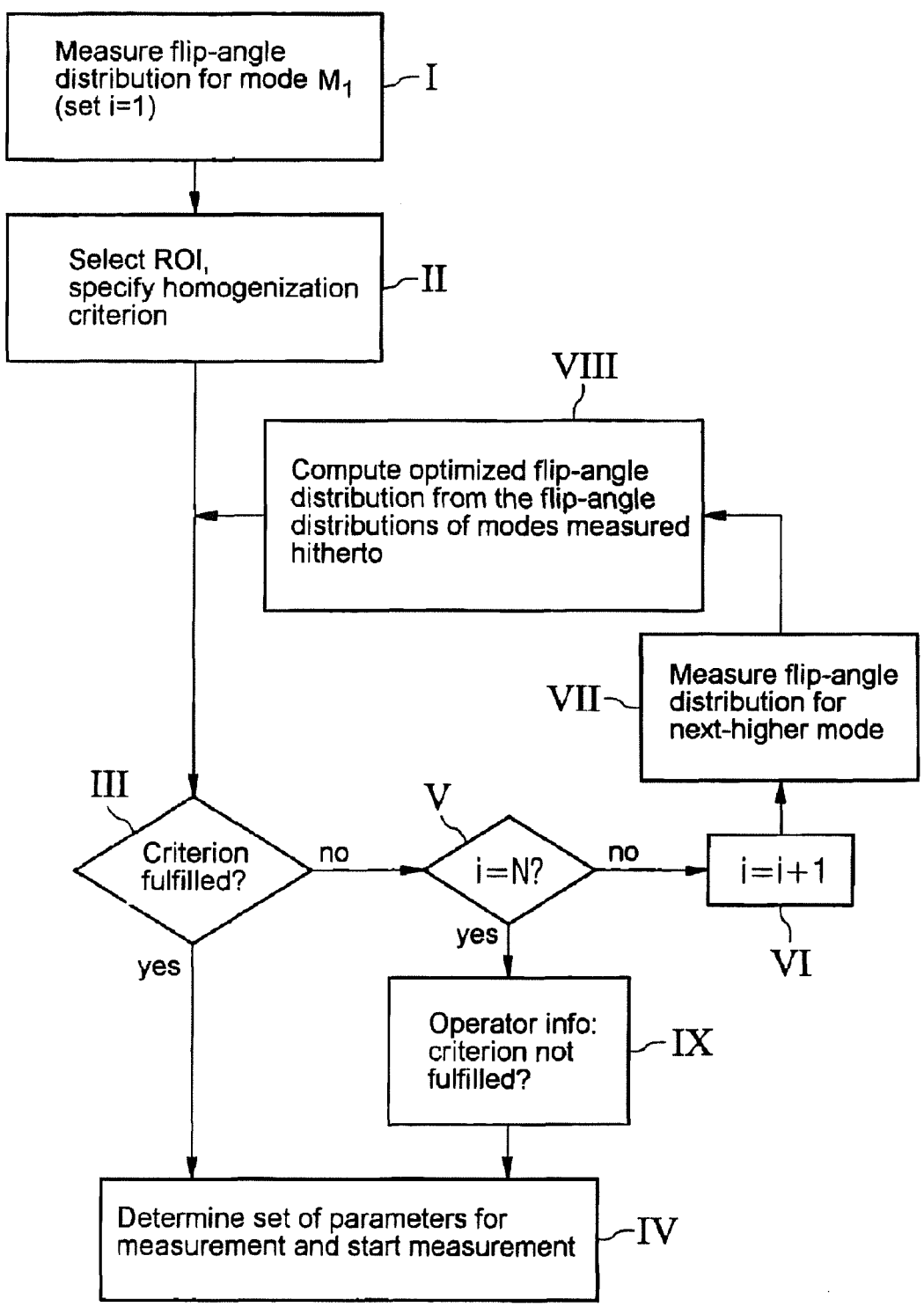

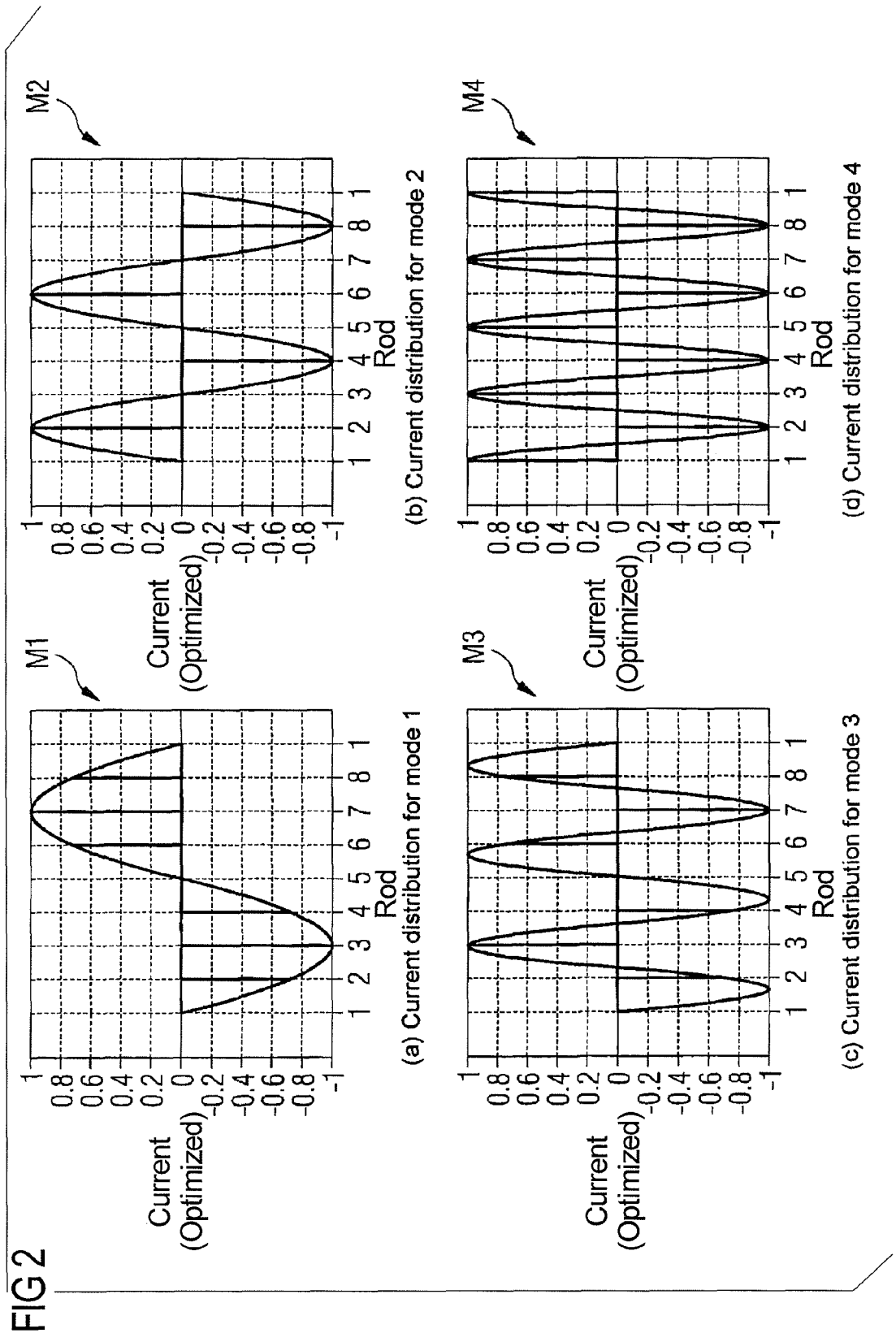

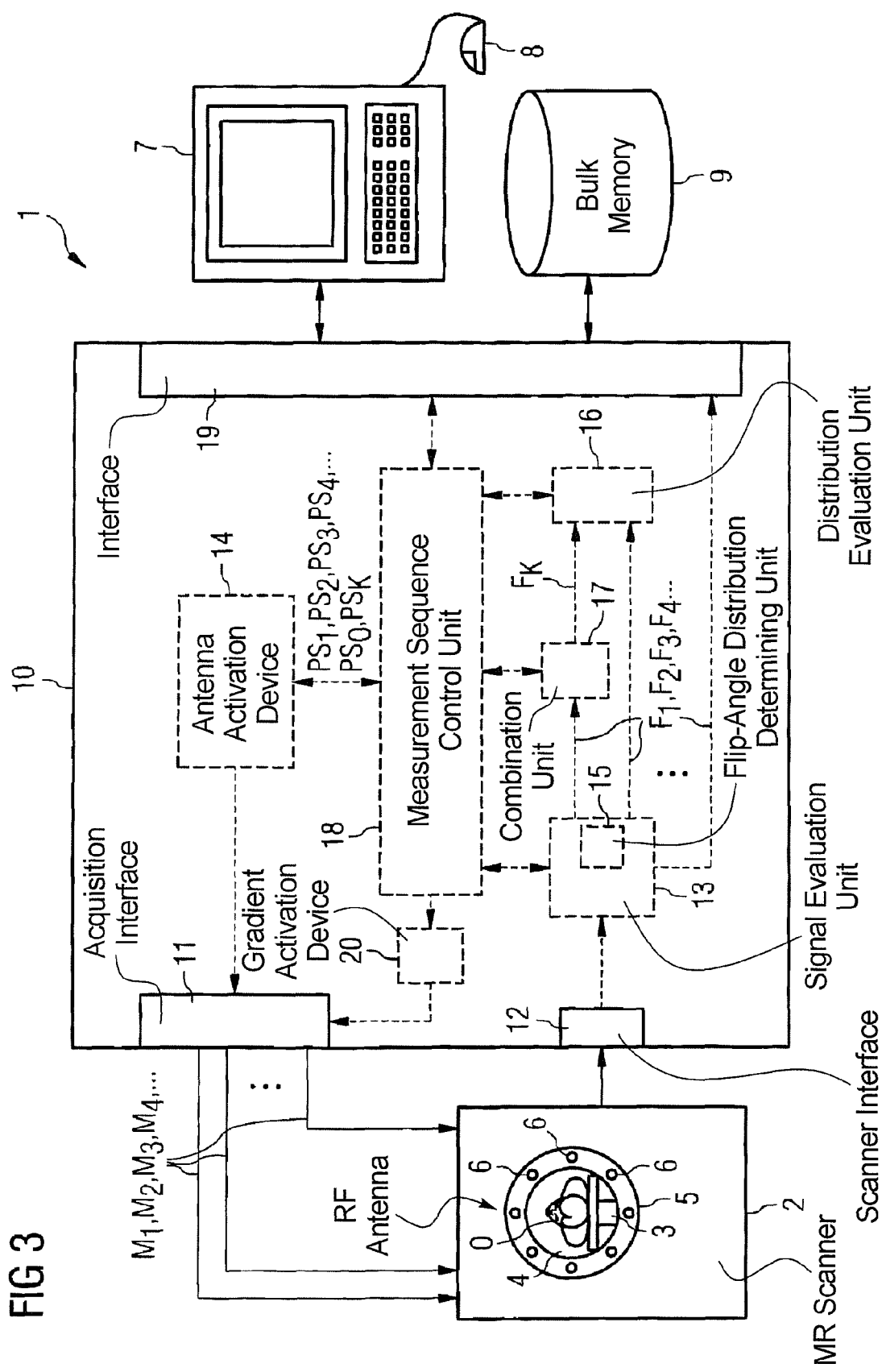

MAGNETIC RESONANCE APPARATUS AND OPERATING METHOD WITH AUTOMATED DETERMINATION OF AN OPTIMIZED RADIO FREQUENCY TRANSMIT MODE

BACKGROUND OF THE INVENTION

1. Field of the Invention

The present invention relates to a method for controlling a magnetic resonance system for implementing a magnetic resonance measurement in at least one defined volume area of interest inside an examination object, the magnetic resonance system being of the type having a radio-frequency antenna having a number of resonator elements that can be excited in different transmit (transmission) modes to generate linearly independent radio-frequency field distributions an examination volume that includes the examination object. In addition, the invention relates to a magnetic resonance system, suitable for implementing such a method, having a corresponding radio-frequency antenna and to a computer program product which, in order to implement the method, can be loaded into a memory of a programmable control unit of such a magnetic resonance system.

2. Description of the Prior Art

Magnetic resonance tomography is a now widely used technology for obtaining images of the interior of the body of a living examination object. In order to obtain an image by this method, the body or body part to be examined of the patient must be exposed to as homogeneous as possible a static main magnetic field (usually called $B_0$ field) which is generated by a main field magnet of the magnetic resonance apparatus. During the acquisition of magnetic resonance images, rapidly switched gradient fields, which are generated by gradient coils, are superimposed on this main magnetic field for location coding. In addition, radio-frequency pulses of a defined field strength are irradiated into the examination object by radio-frequency antennae. The magnetic flux density of these radio-frequency pulses is usually designated $B_1$. The pulse-shaped radio-frequency field is therefore generally also abbreviated as the $B_1$ field. By means of these radio-frequency pulses, the nuclear spins of the atoms in the examination object are excited such that they are deflected from their position of equilibrium parallel to the main magnetic field $B_0$ by a so-called "excitation flip angle" (in general, also abbreviated to "flip angle"). The nuclear spins then precess around the direction of the main magnetic field. The magnetic resonance signals generated thereby are acquired (detected) by radio-frequency receiving antennas. The receiving antennas can be either the same antennas that are also used to emit the radio-frequency pulses, or separate receiving antennas. The magnetic resonance images of the examination object are finally created on the basis of the acquired magnetic resonance signals. Each pixel in the magnetic resonance image is assigned to a small body volume, called a "voxel", and each brightness or intensity value of the pixels is linked to the amplitude of the magnetic resonance signal received from this voxel. The correlation between a resonantly irradiated radio-frequency pulse of field strength $B_1$ and the flip angle $\square$ achieved therewith is given by the equation $$\alpha = \int_{t=0}^{\tau} \gamma \cdot B_1(t) \cdot dt \quad (1)$$

wherein $\gamma$ is the gyromagnetic ratio, which for most nuclear spin examinations can be considered a fixed material constant, and $\tau$ is the effective duration of the radio-frequency pulse. The flip angle achieved by an emitted radio-frequency pulse and thus the strength of the magnetic resonance signal consequently depends not only on the duration of the pulse but also on the strength of the irradiated $B_1$ field. Spatial fluctuations in the field strength of the exciting $B_1$ field therefore lead to undesired variations in the magnetic resonance signal received, and these variations can distort the measurement result.

Disadvantageously, however, it is precisely where magnetic field strengths are high—which is necessarily the case because of the main field $B_0$ that is needed in a nuclear spin tomograph—that radio-frequency pulses display non-homogeneous penetration behavior in conductive and dielectric media such as, e.g., body tissue. The result is that the $B_1$ field can vary greatly within the measurement volume. Particularly in the ultra-high field range with magnetic field strengths $B_0 \geqq 3$ T, significant influences of radio-frequency penetration behavior on image quality are observed. Due to $B_1$ focusing and shielding effects, the flip angle of the high-frequency pulses becomes a function of the location. Contrast and brightness of the recorded magnetic resonance images thus vary in the imaged tissue and can in the worst cases result in pathological structures not being visible.

As a promising approach toward solving this problem, multi-channel transmit coils, also called transmit arrays, are currently under discussion. These are radio-frequency antennas of the type described in the introduction formed by a number of resonator elements or antenna elements that can be activated individually or in groups, i.e. in different transmit configurations. This is possible, for example, if the individual resonator elements are electromagnetically decoupled from one another and can be activated with an individual amplitude and phase over separate radio-frequency channels. Different radio-frequency distributions form in the examination volume of the antenna depending on the amplitudes and phases with which the different transmit configurations are to be excited. For example, it is possible to generate with an antenna having N electromagnetically decoupled and individually controllable resonator elements, N linearly independent field distributions. A simple example of this is a birdcage resonator having rods that can each be activated individually with regard to their amplitude and phase. Each of these rods generates, independently of one another, a $B_1$ field, the $B_1$ fields of the individual rods being superimposed in relation to the overall field distribution.

Instead of looking at the separate resonator elements individually, different "collective excitation modes" can be excited individually using an antenna of this type. In order to activate such collective modes, also called "transmit modes" or "field modes", for example, a fixed-output mode matrix (e.g. a Butler matrix) can be installed in the hardware used for activating the antenna elements. Alternatively, appropriate activation of the individual antenna elements can be achieved for by software.

Through individual settings of the amplitude and phase of the radio-frequency pulse emitted by each transmit configuration, influence can be exerted on the spatial distribution of the $B_1$ field with the aim of generating a radio-frequency field in the object or in the examination volume that is as homogeneous as possible. Magnetic resonance apparatuses of this type are described for example in U.S. Pat. No. 6,043,658 and DE 10 2004 045 691 A1.

From DE 10 2004 013 422 A1, a method and a magnetic resonance system for homogenizing a B1 field are known. Homogenization of the B1 field is achieved in iteration steps. In a first iteration step, measurement data is acquired that represents a B1 field distribution in at least one part of an examination volume, a B1 homogeneity analysis subsequently being implemented automatically on the basis of the acquired measurement data. Automatic selection of a defined homogenization action from a number of possible homogenization actions is then implemented on the basis of the B1 homogeneity analysis. A selected homogenization action is subsequently implemented in order ultimately to homogenize the B1 field.

A hitherto unresolved problem, however, is that of determining the transmit parameters for the individual antenna elements so that is as homogenous as possible that a $B_1$ distribution is actually achieved in the patient, or at least in the region of interest (ROI) for the desired imaging. One possible approach to determining the parameters could take the form of a distribution of the $B_1$ field with regard to the magnitude and phase thereof being transmitted for each individual resonator element. An overview display would then have to be determined with all the resonator elements being active. An optimization region (e.g. the ROI) must then be identified and, furthermore, the activation parameters computed for the homogenized excitation. Such measurements are, however, extraordinarily time-consuming. The total adjustment time can take up to 10 minutes. This method is consequently not very suitable as an adjustment method in practice.

SUMMARY OF THE INVENTION

An object of the present invention is to provide a possibility for determining in a rapid manner, i.e. in a short adjustment time, a sufficiently good set of RF transmit parameters for a planned magnetic resonance measurement.

This object is achieved by a method according to the invention wherein:
a) Firstly, a measured-value distribution representing the radio-frequency distribution is determined in the defined volume area while a first transmit mode is excited. This measured-value distribution is preferably a flip-angle distribution. The flip angle α measured at a defined location is, as explained above, representative of the $B_1$ field irradiated at the location concerned, the dependence being given by equation (1). With this equation (where the pulse used is known), any flip-angle distribution can be converted into a $B_1$ field distribution and vice versa.
b) The homogeneity of the measured-value distribution for this first transmit mode in the defined volume area is then evaluated with regard to certain predetermined evaluation criterion. If the evaluation criterion is already fulfilled when the first transmit mode is emitted, the desired magnetic resonance measurement can be implemented immediately with the first transmit mode. The parameter then used as the set of transmit parameters is precisely that which is needed in order to excite the first transmit mode.

If, however, the evaluation criterion is not fulfilled, the following further steps are implemented:
c) Firstly, excitation of the radio-frequency antenna is then carried out in a further transmit mode (instead of the previously excited transmit mode), in order to determine again for this transmit configuration also a measured-value distribution representing the radio-frequency distribution in the defined volume area. Here, a measured-value distribution corresponding to the measured-value distribution determined in step a), again, for example, a flip-angle distribution, is determined.
d) Next, a measured-value distribution that is optimized with regard to homogeneity in the defined volume area is computed on the basis of a combination of the measured-value distributions measured up to that point for the various transmit modes.
e) Then, the homogeneity of the computed optimized measured-value distribution in the defined volume area is determined with regard to the defined evaluation criterion. If the evaluation criterion should now be fulfilled, then an optimized set of transmit parameters can be determined on the basis of the optimized measured-value distribution computed previously in step d) and the desired magnetic resonance measurement can then be implemented with the optimized set of transmit parameters. Only if the evaluation criterion is not yet fulfilled at this point in time are steps c) to e) repeated with the further transmit modes.

The method according to the invention is based on the dual nature of the view of individual resonator elements and the collective transmit modes. Thus, on the one hand, a transmit mode describes the distribution of currents on all the resonator elements. On the other hand, however, the current in a resonator element can also be described by a combination of number of transmit modes. By measuring the field distribution for the individual collective transmit modes rather than for the individual resonator elements and by adopting a gradual approach in applying the method, the number of steps for setting the homogeneity and thus the adjustment time can be reduced significantly. This is due, among other things, to the fact that not all the transmit modes contribute uniformly to homogenization. The method should therefore preferably commence with the particular mode which has the greatest influence on homogeneity. In the most favorable case, with the inventive method a measurement with just one transmit mode will suffice, if the homogeneity is already good enough. In the worst case, the adjustment can at most take as much time as a complete measurement of all the individual resonator elements would require in order then to determine therefrom the optimum set of transmit parameters.

A magnetic resonance system according to the invention should have, besides the radio-frequency antenna having a number of resonator elements that can be activated individually or in groups, and an antenna activation device for exciting the resonator elements in different transmit modes to generate linearly independent radio-frequency distributions, the following additional components:
a measured-value distribution determining unit for determining a measured-value distribution representing the radio-frequency field distribution in at least one volume area inside the examination object while a defined transmit mode of the radio-frequency antenna is excited,
an evaluation unit for automatically evaluating the homogeneity of a measured-value distribution in the volume area with regard to a defined evaluation criterion,
a combination unit for computing, on the basis of a combination of measured-value distributions measured with various transmit modes, a measured-value distribution that is optimized with regard to homogeneity in the defined volume area,
and a measurement sequence control unit which is configured in such a manner and which activates the antenna activation device, the measured-value distribution determining unit, the evaluation unit and the combination unit such that in order to implement a magnetic resonance measurement in at least one defined volume area inside an examination object the above-mentioned method steps a) to e) are implemented.

The antenna activation device, the measured-value distribution determining unit, the evaluation unit, the combination unit and the measurement sequence control unit are preferably at least in part integrated within the usual system control unit that is used for controlling the magnetic resonance system. The antenna activation device, the measured-value distribution determining unit, the evaluation unit, the combination unit and the measurement sequence control unit can also be configured in a number of parts, i.e. consist of various modules which, for example, are integrated in the different components of the system control unit. Implementation is preferably in the form of one or more software modules which can be called as an antenna activation program module, measurement-value distribution determining program module, evaluation program module, combination program module or measurement sequence control program module within a computer-aided control unit of the magnetic resonance system. A computer-aided control unit is understood here to be a control unit that is equipped with a suitable processor and additional components in order to execute the intended control, measurement and/or computation programs.

As noted above, not all the modes contribute equally to homogeneity. Instead, the gain in homogeneity is determined primarily by lower transmit modes, i.e. transmit modes of a lower order, while the higher transmit modes bring only small improvements. Therefore, in a preferred exemplary embodiment of the invention, a basic transmit mode of the radio-frequency antenna is used as a first transmit mode and in the subsequent determinations of the measured-value distribution in the above-mentioned step c) a next higher transmit mode of the radio-frequency antenna, i.e. a transmit mode of the next higher order, is then excited in each case. In this way, the method can be speeded up. As a rule, four measurement steps suffice for an antenna with eight resonance elements even in a most unfavorable case.

In order in step d) of the method to determine an optimized measured-value distribution on the basis of a combination of the measured-value distributions measured up to that point for the various transmit modes, a linear combination of the various measured-value distributions is preferably formed, it being particularly preferable for the linear combination of the measured-value distributions of the various transmit modes to be weighted with regard to their amplitude and their phase.

A limitation of the amplitude parameters is preferably also possible here in order to regulate certain effects such as e.g. the loading of the individual components or a local SAR (specific absorption ratio). This can ensure that defined loading thresholds are not exceeded and locally determined SAR threshold values are complied with.

A wide variety of criteria can be used for evaluating homogeneity. One possible criterion is an evaluation of the standard deviation of the measured values, e.g. of the flip angle, in the selected zone. For this a limit standard deviation is set, for example, and if the standard deviation of the measured-value distribution lies below this limit standard deviation, the evaluation criterion is deemed to have been fulfilled.

In another preferred exemplary embodiment, a check is carried out when evaluating the homogeneity of a measured-value distribution as to whether a local measured value (e.g. flip angle) falls below or exceeds a defined threshold value in the defined volume area.

Alternatively, it can be checked when evaluating the homogeneity of a measured-value distribution whether a value derived from a local measured value, in particular a relative value, i.e. the ratio of the local measured value to an average measured value in the slice, falls below or exceeds a predetermined threshold value in the defined volume area.

A combination of the various methods is likewise also possible, i.e. for example, an adequate homogeneity is deemed to apply only when both the standard deviation and the absolute and the relative measured values lie within defined threshold values.

Since, however, only a limited number of linearly independent transmit modes is available (which is identical to the number of resonator elements), it cannot be ruled out that in an isolated case, even if all the transmit modes are considered, a set homogeneity evaluation criterion will not be fulfilled. Therefore, if the evaluation criterion is not fulfilled even after all the different transmit modes with which the linearly independent radio-frequency distributions can be generated have been excited, a set of transmit parameters is determined on the basis of the optimized measured-value distribution computed when the above-mentioned step d) was last implemented. In this way, the best possible set of transmit parameters that can be achieved in the particular case is consequently determined. The desired magnetic resonance measurement can then be implemented with this determined set of transmit parameters.

Advantageously, in such a case, an appropriate alarm is also output to an operator of the magnetic resonance system so that said operator is made aware that, while a predetermined homogeneity criterion is not fulfilled, nonetheless the best possible set of transmit parameters has been selected.

It is then within the discretion of the operator to implement or optionally cancel the measurement and e.g. to improve homogeneity within the measurement volume by means of appropriate aids such as, for example, dielectric cushions or similar elements.

Preferably, in any case prior to implementation of the corresponding measurement, a corresponding confirmation is expected by the operator, it also being possible for the optimized transmit parameters that have been determined to be displayed to the operator.

DESCRIPTION OF THE DRAWINGS

FIG. 1 shows a flow diagram of a possible sequence of the method according to the invention.

FIG. 2 shows the distribution of current in the rods of a birdcage antenna having a total of eight rods for the first four modes (diagrams (a) to (c)).

FIG. 3 shows a schematic diagram of a magnetic resonance apparatus according to the invention.

DESCRIPTION OF THE PREFERRED EMBODIMENTS

A possible measurement, evaluation and computation process according to a variant of the inventive method is shown in FIG. 1 with a flowchart.

In step I, firstly a flip-angle distribution inside the region of interest is measured for the first transmit mode $M_1$. For a birdcage antenna with eight rods, the current distribution is represented for this first mode $M_1$ (diagram a) of FIG. 2). The current is plotted here (in relative units) over the individual rods 1 to 8. As can clearly be seen, in the first mode $M_1$, the basic mode, a current distribution is plotted such that a current period is distributed precisely between the eight rods. That is, in a phase in which—as shown in FIG. 2—no current is being applied to the first and the fifth rods, the maximum current is being applied to the third and seventh rod, the numbering of the rods being arbitrary.

With such a resonator with N=8 rods, in principle N=8 different, linearly independent transmit modes can be generated, the assignment between modes and bar currents I being fixed as follows:

$$I(k, m) = A(m) \cdot e^{\left(j \cdot m \cdot k \cdot \frac{2\pi}{N}\right)} \qquad (2)$$

Here, $$k = 0, \ldots, N-1 \qquad (3)$$

is the rod number, $$m = -\left(\frac{N}{2+1}\right) \ldots, 0, \ldots \left(\frac{N}{2}\right) \qquad (4)$$

the mode number and j specifies the imaginary part.

The basic mode $M_1$ shown in (diagram (a) of FIG. 2) with m=1 supplies a field which generates a homogeneous field in the unloaded antenna. This corresponds also to the excitation normally selected. The other higher modes produce a corresponding high-order current distribution on the bars. Die modes $M_2$, $M_3$, $M_4$ for m=2, m=3 and m=4 are shown in diagrams (b) to (d) in FIG. 2. These modes $M_2$, $M_3$, $M_4$ can be used to improve homogeneity. The mode m=0 and the negative modes as a rule contribute nothing or only very little toward improving homogeneity in such an 8-rod birdcage antenna.

A variety of methods for measuring the flip-angle distribution in step I are known to the person skilled in the art. For the method according to the invention, a very simple gradient echo method can basically be used which works relatively fast. Both a three-dimensional measurement inside the examination object and a slice-by-slice two-dimensional measurement are possible.

In step II, the actual region of interest ROI is defined and a homogeneity criterion stipulated for this area. The stipulation of the region of interest ROI at this point in time has the advantage that the flip-angle distribution which was measured in step I can be used for defining the region of interest ROI. In principle, it is also possible to select an area of interest even before step I and to record the flip-angle distribution in step I optionally only in this area or generously around this area.

A check is than carried out in step III as to whether the homogeneity criterion defined in step II is fulfilled by the flip-angle distribution measured in the defined region of interest ROI. If this is the case, then in step IV the appropriate set of parameters for exciting the first mode $M_1$ for transmitting the high-frequency pulses can be used for the actual magnetic resonance imaging, and the measurement can be started.

Otherwise, in step V a control variable i is checked to ascertain whether it already corresponds to the maximum number of available transmit modes, i.e. the number of resonator elements N.

If this is not the case, then in step VI the control variable i is incremented by 1, and then in step VII a new flip-angle distribution is measured with the next higher mode. That is, in the first pass, the flip-angle distribution is measured in step VII with the second mode $M_2$, as shown for example in diagram b) of FIG. 2b.

Then, in step VIII an optimized flip-angle distribution is computed from the previous measurements—in the first pass from the measurements with the two modes $M_1$ and $M_2$. A linear combination of the flip-angle distributions is generated in a simple manner, flip-angle distributions for the modes being given when superimposed both an amplitude weighting and a phase weighting. Care is also taken to ensure that the amplitude parameters do not exceed defined threshold values in order to ensure that the components are not too heavily loaded and that local SAR threshold values are complied with.

A check is then again carried out in step III as to whether for this computed optimized flip-angle distribution the homogeneity evaluation criterion defined in step II is fulfilled for the defined region of interest ROI. If this is the case, then the optimized set of parameters that has to be used in order to guarantee a correspondingly optimized homogeneous $B_1$ field when the magnetic resonance image being generated is determined immediately in step IV. This is simple insofar as those parameters which were determined previously in step VIII in order to compute the optimized flip-angle distribution can be drawn upon for this purpose. I.e. the various amplitudes and phases are already known from these computations.

If in step III the criterion is still not fulfilled, then in step V a check is again carried out as to whether the control variable i has reached the number of possible modes N and otherwise in step VI incremented the control variable i by 1 and in step VII implemented a fresh measurement with the next higher mode, for example then with the third mode $M_3$ shown in diagram c) in FIG. 2d.

A computation is again carried out in step VIII, three flip-angle distributions now being linearly superimposed, and then the check in step III again made as to whether the homogeneity evaluation criterion for the optimized flip-angle distribution is now fulfilled.

This method is continued until such time as either it is established that a distribution has been found that fulfills the homogeneity optimization criterion, or it is established in step V that all the transmit modes have already been included in the computed optimum flip-angle distribution. If this is the case, then in step IX the operator is informed that it was not possible to fulfill the homogeneity evaluation criterion, and then in step VI a set of parameters is determined which is based on the last computation in step VIII. I.e. in the end the best possible set of parameters for this case is used.

Instead of the number N of overall possible modes, a lower number could also be set corresponding to the number of just those modes which can contribute significantly to improving homogeneity.

FIG. 3 shows a simple schematic block diagram in respect of an exemplary embodiment of a magnetic resonance system 1 with which the method according to the invention can be implemented.

The basis of this magnetic resonance system 1 is a recording device 2, also called a "tomograph" or "scanner", in which a patient O is positioned on a support 3 in an annular main field magnet. Located inside the main field magnet is a radio-frequency antenna 5 for emitting the high-frequency MR pulses. The antenna 5 here is formed by N resonator elements 6 that can be activated individually with high-frequency pulses. This may, for example, be an antenna structure like that described in U.S. Pat. No. 6,043,658 or in DE 10 2004 045 691 A1. The tomograph also has the customary gradient coils (not shown) for emitting suitable gradient pulses for location coding.

The scanner 2 is activated by a system control unit 10, which is shown separately here. Connected to the system control unit 10 are a terminal 7 with a pointing device, for example a mouse 8, for operating a graphic user interface, and a bulk memory 9. The terminal 7 serves as a user interface via which an operator operates the system control unit 10 and thus the tomograph 2. The mass memory 9 serves, for example, for storing images recorded by means of the magnetic resonance system. The terminal 7 and the memory 9 are connected via an interface 19 to the system control unit 10.

The system control unit 10 has a scanner interface 11 which is connected to the scanner 2 and which, in accordance with the measurement sequence protocol predetermined by the system control unit 10, emits the radio-frequency pulses with the suitable amplitudes and phases for the individual resonator elements 6 and the appropriate gradient pulses.

In addition, the system control unit 10 is connected via an acquisition interface 12 to the scanner 2. The measurement data coming from the scanner 2 are acquired via the acquisition interface 12 and assembled in a signal evaluation unit 13 into images which are then, for example, displayed via the interface 19 on the terminal 7 and/or filed in the memory 9. One component of the signal evaluation unit 13 here is a flip-angle distribution determining unit 15 which generates simple images of flip-angle distributions for representing the existing $B_1$ field. These flip-angle distributions can in this way also be displayed on the terminal 7 and the operator, e.g. with the aid of the mouse 8, can specify the region of interest ROI in which the selected homogeneity evaluation criterion is to be fulfilled.

Both the system control unit 10 and the terminal 7 and memory 9 can also be an integral part of the tomograph 2. Similarly, however, the system control unit 10 can also be formed by a number of individual components. In particular, e.g. the antenna activation device 14 can be configured as a separate unit connected via a suitable interface to the system control unit 10.

The entire magnetic resonance system 1 also has all other customary components or features such as e.g. interfaces for connecting to a communications network, for example an image information system (Picture Archiving and Communication System, PACS). However, for clarity, these components are not shown in FIG. 3.

The operator can communicate via the terminal 7 and the interface 19 with a measurement sequence control unit 18 in the system control unit 10. This measurement sequence control unit provides the antenna activation device 14 and a gradient activation device 20, by means of which the gradients are appropriately controlled, with suitable pulse sequences. I.e. the measurement sequence control unit 18 provides for the emission of appropriate radio-frequency pulse sequences by the antenna 5 and for suitable switching of the gradients in order to implement the desired measurements.

As already explained above, the signal evaluation unit 13, has, here as a sub-module, a flip-angle distribution determining unit 15. The flip-angle distribution $F_1$, $F_2$, $F_3$, $F_4$, ... determined can then be transferred to a distribution evaluation unit 16 and/or to a combination unit 17. Both the signal evaluation unit 13 or flip-angle distribution determining unit 15 and the combination unit 17 and the evaluation unit 16 are, just like the antenna activation device 14 and the gradient activation device 20, activated by the measurement sequence control unit 18.

This measurement sequence control unit 18, particularly for the measurement of a flip-angle distribution $F_1$, $F_2$, $F_3$, $F_4$, ... with a defined transmit mode $M_1$, $M_2$, $M_3$, $M_4$, ..., can transfer a corresponding set of parameters $PS_1$, $PS_2$, $PS_3$, $PS_4$, ... to the antenna activation device 14 and suitable parameters to the gradient activation device 20, which then correspondingly via the scanner interface 11 activates the antenna 5 such that a transmit mode $M_1$, $M_2$, $M_3$, $M_4$ ... is emitted according to the predetermined set of parameters $PS_1$, $PS_2$, $PS_3$, $PS_4$, .... Thus a measurement made with a measurement sequence is initiated by the measurement sequence control unit 18 so that when the high-frequency pulses are emitted in the predetermined transmit mode $M_1$, $M_2$, $M_3$, $M_4$, ... a flip-angle distribution $F_1$, $F_2$, $F_3$, $F_4$, ... can be recorded by the flip-angle distribution determining unit 15. The flip-angle distribution $F_1$, $F_2$, $F_3$, $F_4$, ... measured for the respective mode $M_1$, $M_2$, $M_3$, $M_4$, ... is then transferred by the flip-angle distribution determining unit 15 to the evaluation unit 16 and the combination unit 17.

After corresponding activation by the measurement sequence control unit 18, the evaluation as per step III in FIG. 1 is then carried out, for example, during measurement of the first transmit mode $M_1$ as per step I in FIG. 1 by the evaluation unit 16. The result is delivered to the measurement sequence control unit 18. If the result is satisfactory, the measurement sequence control unit 18 transfers the optimized set of parameters $PS_O$ found to the antenna activation device 14, so that the actual measurement is implemented with this set of parameters $PS_O$ and the signal evaluation unit 13 can generate the desired magnetic resonance images with the aid of the signals determined.

If the evaluation criterion is not fulfilled, then the measurement sequence control unit 18 initiates, by transferring a further set of parameters $PS_2$, measurement with the second transmit mode $M_2$, whereupon the measured-value distribution determining unit 15 measures a corresponding flip-angle distribution $F_2$ and transfers this likewise to the combination unit 17. The combination unit 17 then combines this flip-angle distribution $F_2$ with the previously measured flip-angle distribution $F_1$ and delivers the result, a combined flip-angle distribution $F_K$, on to the evaluation unit 16. This evaluation unit evaluates the flip-angle distribution $F_K$ as described previously and delivers the result in turn to the measurement sequence control unit 18. If the result is satisfactory, then the measurement sequence control unit 18 can, on the basis of the data supplied by the combination unit 17, draw up from the optimized combination of flip-angle distributions $F_1$, $F_2$ an optimized set of parameters $PS_O$ and then with this optimized set of parameters activate the antenna activation device 14 for the actual measurement.

Where no satisfactory result is achieved even with the last available transmit mode, the measurement sequence control unit 18 nonetheless receives from the combination unit 17 the data necessary to generate the at least best possible set of parameters $PS_K$ and then to transfer this set of parameters to the antenna activation device 14 for the subsequent magnetic resonance measurement. Simultaneously, an alarm can be output via the interface 19 to the operator on the terminal 7.

As a rule, at least the measurement sequence control unit 18, the signal evaluation unit 13, the flip-angle distribution determining unit 15, the combination unit 17 and the evaluation unit 16 are implemented in the form of software modules on a processor of the system control unit 10. Implementation purely in software form has the advantage that even existing magnetic resonance apparatuses can be upgraded by means of an appropriate software upgrade. It is also possible here for the units 13, 15, 16, 17, 18 or corresponding software modules shown respectively as individual blocks in FIG. 3 to consist of a plurality of components or subroutines. These subroutines may also already be in use by other components of the system control unit 10, i.e. existing subroutines of other program units will optionally also be drawn upon so as to keep the cost of implementing the modules necessary according to the invention as low as possible.

The method described in detail herein and the magnetic resonance system shown are only exemplary embodiments that may be modified in a variety of ways by those skilled in the art without departing from the scope of the invention. The invention has been explained principally with reference to application in a medically used magnetic resonance apparatus, but it is not restricted to applications of this type but also can be used in scientific and/or industrial applications.

I claim as my invention:

1. A computerized method for controlling a magnetic resonance system for implementing a magnetic resonance measurement in at least one defined volume area in an examination object, said magnetic resonance system comprising a radio-frequency antenna having a plurality of resonator elements that can be excited in different transmit modes, dependent on respective transmit parameters supplied thereto, to generate linearly independent radio-frequency field distributions at least in said volume area, comprising the steps of:
 (a) from a computerized control system, operating said magnetic resonance system to measure a measured-value distribution representing a radio-frequency field distribution in said volume area while said radio-frequency antenna is excited in a first transmit mode;
 (b) said computerized control system, automatically evaluating a homogeneity of said measured value distribution in said volume area with respect to a defined evaluation criterion and, if said evaluation criterion is satisfied, operating said magnetic resonance system from said computerized control system to implement a diagnostic magnetic resonance data acquisition with said radio-frequency antenna operated in said first transmit mode to obtain diagnostic image data at an output of said computerized control system; and
if said evaluation criterion is not satisfied:
 (c) operating said magnetic resonance system from said computerized control system to measure a second measured-value distribution representing the radio-frequency field distribution in said volume area while exciting said radio-frequency antenna in a second transmit mode;
 (d) in said computerized control system, automatically computing an optimized measured-value distribution that is optimized with regard to said homogeneity in said volume area from a combination of all of said measured-value distributions produced for all of the transmit modes that have occurred up to a time of the computation; and
 (e) in said computerized control system, automatically evaluating the homogeneity of the optimized measured value distribution in said volume area with respect to said defined evaluation criterion and, (1) if said evaluation criterion is fulfilled, automatically determining an optimized set of transmit parameters for exciting said radio-frequency antenna to produce the optimized measured value distribution computed in step (d) and automatically operating said magnetic resonance system from said computerized control system to implement a diagnostic magnetic resonance acquisition with said magnetic resonance system using said optimized set of transmit parameters to obtain diagnostic image data at an output of said computerized control system, and (2) if said evaluation criterion still is not fulfilled by said optimized measured value distribution, automatically repeating steps (c) through (e) with a further transmit mode until said evaluation criterion is fulfilled and, if said evaluation criterion cannot be fulfilled with any available transmit mode, emitting an indicator at an output of said computerized control system.

2. A method as claimed in claim 1 comprising employing, as said first transmit mode in step (a) a basic transmit mode of said radio-frequency antenna and employing, in steps (c), (d) and (e) transmit modes as said second transmit mode and said further transmit mode that are successively next-higher transmit modes compared to said basic transmit mode.

3. A method as claimed in claim 1 comprising, in step (d) automatically electronically calculating said optimized measured value distribution as a linear combination of said measured value distributions up to said time of said calculation.

4. A method as claimed in claim 3 wherein each of said measured value distributions has an amplitude, and comprising forming said linear combination by weighting the respective measured value distributions dependent on their respective amplitudes.

5. A method as claimed in claim 3 wherein each of said measured value distributions has an phase, and comprising forming said linear combination by weighting the respective measured value distributions dependent on their respective phases.

6. A method as claimed in claim 1 comprising, in steps (b) and (e), evaluating said homogeneity by computing the standard deviation of the measured value distribution.

7. A method as claimed in claim 1 comprising, in steps (d) and (e) evaluating said homogeneity by deriving a value from said measured-field distribution in said volume area, and comparing the derived value to a threshold value.

8. A method as claimed in claim 1 wherein said radio-frequency antenna is operable with a total number of different transmit modes and, if said evaluation criterion is not satisfied after excitation of said high frequency antenna with all of said total number of transmit modes, automatically electronically determining said transmit parameters for implementing said diagnostic magnetic resonance acquisition using the optimized measured value distribution computed when step (d) was last implemented.

9. A magnetic resonance system comprising:
 a magnetic resonance scanner configured to interact with an examination object to implement a magnetic resonance measurement in at least one defined volume area in an examination object, said magnetic resonance system comprising a radio-frequency antenna having a plurality of resonator elements that can be excited in different transmit modes, dependent on respective transmit parameters supplied thereto, to generate linearly independent radio-frequency field distributions at least in said volume area; and
 a computerized control system that operates said magnetic resonance scanner to:
 (a) measure a measure-value distribution representing a radio-frequency field distribution in said volume area while said radio-frequency antenna is excited in a first transmit mode;
 (b) automatically evaluate a homogeneity of said measured value distribution in said volume area with respect to a defined evaluation criterion and, if said evaluation criterion is satisfied, implement a diagnostic magnetic resonance data acquisition with said radio-frequency antenna operated in said first transmit mode; and
if said evaluation criterion is not satisfied:
 (c) with said magnetic resonance scanner, measure a second measured-value distribution representing the radio-frequency field distribution in said volume area while exciting said radio-frequency antenna in a second transmit mode;
 (d) automatically compute an optimized measured-value distribution that is optimized with regard to said homogeneity in said volume area from a combination of all of said measured-value distributions produced for all of the transmit modes that have occurred up to a time of the computation; and (e) automatically electronically evaluate the homogeneity of the optimized measured value distribution in said volume area with respect to said defined evaluation criterion and, (1) if said evaluation criterion is fulfilled, automatically electronically determine an optimized set of transmit parameters for exciting said radio-frequency antenna to produce the optimized measured value distribution computed in step (d) and implement a diagnostic magnetic resonance acquisition with said magnetic resonance system using said optimized set of transmit parameters, and (2) if said evaluation criterion is not fulfilled by said optimized measured value distribution, repeat steps (c) through (e) with a further transmit mode until said evaluation criterion is fulfilled and, if said evaluation criterion cannot be fulfilled with any available transmit mode, emit an indicator at an output of said computerized control system.

10. A non-transitory computer-readable storage medium encoded with a data structure, said medium being loadable into a computerized control system of a magnetic resonance system for controlling the magnetic resonance system to implement a magnetic resonance measurement in at least one defined volume area in an examination object, said magnetic resonance system comprising a radio-frequency antenna having a plurality of resonator elements that can be excited in different transmit modes, dependent on respective transmit parameters supplied thereto, to generate linearly independent radio-frequency field distributions at least in said volume area, said data structure causing said computerized control system to:

(a) operate said magnetic resonance system to measure a measure-value distribution representing a radio-frequency field distribution in said volume area while said radio-frequency antenna is excited in a first transmit mode;

(b) automatically evaluate a homogeneity of said measured value distribution in said volume area with respect to a defined evaluation criterion and, if said evaluation criterion is satisfied, implement a diagnostic magnetic resonance data acquisition with said radio-frequency antenna operated in said first transmit mode; and if said evaluation criterion is not satisfied:

(c) operate said magnetic resonance system to measure a second measured-value distribution representing the radio-frequency field distribution in said volume area while exciting said radio-frequency antenna in a second transmit mode;

(d) automatically compute an optimized measured-value distribution that is optimized with regard to said homogeneity in said volume area from a combination of all of said measured-value distributions produced for all of the transmit modes that have occurred up to a time of the computation; and (e) automatically evaluate the homogeneity of the optimized measured value distribution in said volume area with respect to said defined evaluation criterion and, (1) if said evaluation criterion is fulfilled, automatically determine an optimized set of transmit parameters for exciting said radio-frequency antenna to produce the optimized measured value distribution computed in step (d) and operate said magnetic resonance system to implement a diagnostic magnetic resonance acquisition using said optimized set of transmit parameters, and (2) if said evaluation criterion is not fulfilled by said optimized measured-value distribution, repeat steps (c) through (e) with a further transmit mode until said evaluation criterion is fulfilled and, if said evaluation criterion cannot be fulfilled with any available transmit mode, emit an indicator at an output of said computerized control system.

\* \* \* \* \*